United States Patent
Saggio et al.

(10) Patent No.: US 12,148,824 B2
(45) Date of Patent: Nov. 19, 2024

(54) MOSFET DEVICE WITH SHIELDING REGION AND MANUFACTURING METHOD THEREOF

(71) Applicant: STMicroelectronics S.r.l., Agrate Brianza (IT)

(72) Inventors: Mario Giuseppe Saggio, Aci Bonaccorsi (IT); Edoardo Zanetti, Valverde (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 86 days.

(21) Appl. No.: 17/665,398

(22) Filed: Feb. 4, 2022

(65) Prior Publication Data
US 2022/0157989 A1    May 19, 2022

Related U.S. Application Data

(62) Division of application No. 16/528,410, filed on Jul. 31, 2019, now Pat. No. 11,251,296.

(30) Foreign Application Priority Data

Aug. 2, 2018    (IT) .................... 102018000007780

(51) Int. Cl.
*H01L 29/78*   (2006.01)
*H01L 21/70*   (2006.01)
(Continued)

(52) U.S. Cl.
CPC .......... *H01L 29/7813* (2013.01); *H01L 21/70* (2013.01); *H01L 29/063* (2013.01);
(Continued)

(58) Field of Classification Search
CPC ............... H01L 29/0619; H01L 29/063; H01L 29/0696; H01L 29/1095; H01L 29/1608;
(Continued)

(56) References Cited

U.S. PATENT DOCUMENTS 8,283,721 B2 * 10/2012 Nakano ............. H01L 29/66734
                                                               438/270
8,354,711 B2 *  1/2013 Zeng ................... H01L 29/0878
                                                               257/341
(Continued)

FOREIGN PATENT DOCUMENTS

CN    106876485 A    6/2017
CN    107658214 A    2/2018

OTHER PUBLICATIONS

Mitsubishi Electric Corproation, "Mitsubishi Electric Develops Trench-type SiC-MOSFET with Unique Electric-field-limiting Structure," Tokyo, Sep. 30, 2019, 4 pages.
(Continued)

*Primary Examiner* — Maliheh Malek
(74) *Attorney, Agent, or Firm* — Seed IP Law Group LLP

(57) ABSTRACT

A MOSFET device comprising: a structural region, made of a semiconductor material having a first type of conductivity, which extends between a first side and a second side opposite to the first side along an axis; a body region, having a second type of conductivity opposite to the first type, which extends in the structural region starting from the first side; a source region, having the first type of conductivity, which extends in the body region starting from the first side; a gate region, which extends in the structural region starting from the first side, traversing entirely the body region; and a shielding region, having the second type of conductivity, which extends in the structural region between the gate region and the second side. The shielding region is an implanted region self-aligned, in top view, to the gate region.

19 Claims, 9 Drawing Sheets

(51) Int. Cl.
*H01L 29/06* (2006.01)
*H01L 29/10* (2006.01)
*H01L 29/16* (2006.01)
*H01L 29/423* (2006.01)
*H01L 29/66* (2006.01)

(52) U.S. Cl.
CPC ...... *H01L 29/1095* (2013.01); *H01L 29/1608* (2013.01); *H01L 29/4236* (2013.01); *H01L 29/66734* (2013.01); *H01L 29/0619* (2013.01)

(58) Field of Classification Search
CPC .............. H01L 29/7813; H01L 29/7397; H01L 29/4236; H01L 29/0623; H01L 29/66734; H01L 29/41766; H01L 29/7827; H01L 29/66068; H01L 29/66719; H01L 29/0684; H01L 29/4232
See application file for complete search history.

(56) References Cited

U.S. PATENT DOCUMENTS

| | | | | |
|---|---|---|---|---|
| 8,581,341 | B2* | 11/2013 | Darwish | H01L 29/407 257/341 |
| 8,653,590 | B2* | 2/2014 | Frisina | H01L 21/02573 257/331 |
| 8,704,295 | B1* | 4/2014 | Darwish | H01L 29/872 257/334 |
| 9,048,214 | B2* | 6/2015 | Padmanabhan | H01L 29/404 |
| 9,620,585 | B1* | 4/2017 | Loechelt | H01L 29/36 |
| 9,852,910 | B2* | 12/2017 | Yilmaz | H01L 29/0696 |
| 9,887,287 | B1* | 2/2018 | Lichtenwalner | H01L 29/66068 |
| 10,177,251 | B2* | 1/2019 | Shimizu | H01L 29/872 |
| 10,714,574 | B2* | 7/2020 | Yilmaz | H01L 29/407 |
| 11,538,911 | B2* | 12/2022 | Yilmaz | H01L 29/66348 |
| 2002/0175383 | A1* | 11/2002 | Kocon | H01L 29/1095 257/376 |
| 2005/0152080 | A1* | 7/2005 | Harris | H01L 29/1095 257/E29.066 |
| 2007/0145474 | A1 | 6/2007 | Annese et al. | |
| 2008/0169517 | A1* | 7/2008 | Frisina | H01L 29/66068 257/E29.054 |
| 2008/0211015 | A1 | 9/2008 | Arena et al. | |
| 2010/0163978 | A1 | 7/2010 | Magri et al. | |
| 2012/0049202 | A1* | 3/2012 | Nakano | H01L 29/42368 257/77 |
| 2012/0049940 | A1* | 3/2012 | Frisina | H01L 29/7806 257/E29.171 |
| 2012/0261746 | A1* | 10/2012 | Darwish | H01L 29/1095 438/270 |
| 2013/0001592 | A1* | 1/2013 | Miyahara | H01L 29/4236 257/77 |
| 2013/0200451 | A1* | 8/2013 | Yilmaz | H01L 29/086 438/270 |
| 2014/0141603 | A1* | 5/2014 | Frisina | H01L 21/046 438/508 |
| 2015/0162410 | A1* | 6/2015 | Padmanabhan | H01L 29/407 257/488 |
| 2015/0340487 | A1* | 11/2015 | Siemieniec | H01L 29/045 438/237 |
| 2016/0163852 | A1* | 6/2016 | Siemieniec | H01L 29/045 438/237 |
| 2016/0181408 | A1* | 6/2016 | Aichinger | H01L 29/7813 257/77 |
| 2016/0260709 | A1* | 9/2016 | Rupp | H01L 29/045 |
| 2016/0260798 | A1* | 9/2016 | Rupp | H01L 29/4238 |
| 2016/0260829 | A1* | 9/2016 | Aichinger | H01L 29/66719 |
| 2016/0359029 | A1* | 12/2016 | Zeng | H01L 29/4236 |
| 2017/0054012 | A1* | 2/2017 | Hutzler | H01L 29/6634 |
| 2017/0077239 | A1* | 3/2017 | Shimizu | H01L 29/45 |
| 2017/0133504 | A1* | 5/2017 | Shiomi | H01L 29/0834 |
| 2017/0162649 | A1* | 6/2017 | Kagawa | H01L 29/7827 |
| 2017/0263712 | A1* | 9/2017 | Siemieniec | H01L 29/1608 |
| 2017/0345905 | A1* | 11/2017 | Siemieniec | H01L 29/045 |
| 2018/0122926 | A1 | 5/2018 | Menta et al. | |
| 2018/0175150 | A1* | 6/2018 | Mauder | H01L 21/02337 |
| 2018/0182750 | A1* | 6/2018 | Burke | H01L 29/7803 |
| 2018/0277637 | A1* | 9/2018 | Meiser | H01L 29/7804 |
| 2018/0308938 | A1* | 10/2018 | Siemieniec | H01L 29/0696 |
| 2018/0331204 | A1* | 11/2018 | Aichinger | H01L 29/7813 |
| 2018/0337275 | A1* | 11/2018 | Shimizu | H01L 29/872 |
| 2018/0358449 | A1* | 12/2018 | Zeng | H01L 29/66348 |
| 2018/0366569 | A1* | 12/2018 | Zeng | H01L 29/7813 |
| 2019/0172910 | A1* | 6/2019 | Siemieniec | H01L 29/1095 |
| 2019/0259841 | A1* | 8/2019 | Stegner | H01L 29/41741 |
| 2019/0273157 | A1* | 9/2019 | Yilmaz | H01L 29/66727 |
| 2019/0348510 | A1* | 11/2019 | Yilmaz | H01L 29/4236 |
| 2019/0355819 | A1* | 11/2019 | Siemieniec | H01L 29/0623 |
| 2019/0393299 | A1* | 12/2019 | Huerner | H01L 29/0882 |
| 2020/0006544 | A1* | 1/2020 | Siemieniec | H01L 29/7802 |
| 2020/0013723 | A1* | 1/2020 | Fuergut | H01L 21/0485 |
| 2020/0243656 | A1* | 7/2020 | Shibib | H01L 29/404 |
| 2020/0303507 | A1* | 9/2020 | Yilmaz | H01L 29/4236 |
| 2021/0036104 | A1 | 2/2021 | Santangelo et al. | |
| 2021/0151599 | A1 | 5/2021 | Magri' et al. | |
| 2021/0183849 | A1 | 6/2021 | Patti | |
| 2021/0242323 | A1 | 8/2021 | Patti et al. | |

OTHER PUBLICATIONS

Peters et al., "The new CoolSiC™ Trench MOSFET Technology for Low Gate Oxide Stress and High Performance," PCIM Europe 2017, May 16-18, 2017, Nuremberg, Germany, pp. 168-174.

Williams et al., "The Trench Power MOSFET: Part I—History, Technology, and Prospects," *IEEE Transactions on Electron Devices* 64(3):674-691, Mar. 2017.

* cited by examiner

MOSFET DEVICE WITH SHIELDING REGION AND MANUFACTURING METHOD THEREOF

BACKGROUND

Technical Field

The present disclosure relates to a silicon carbide MOSFET device and to a manufacturing method thereof. In particular, the present disclosure relates to a MOSFET device with low on-state resistance and high reliability.

Description of the Related Art

Known to the art are MOSFETs (Metal-Oxide-Semiconductor Field-Effect Transistors) made of silicon carbide (SiC) for power-electronics applications. In particular, the silicon carbide MOSFETs present advantages over power MOSFETs of a conventional type, thanks to their characteristics of reduction of the energy losses and to their small dimensions.

An aim in the design of a silicon carbide MOSFET regards protection of the gate-dielectric regions in reverse-biasing conditions during use of the transistor, i.e., when the aforesaid regions are subject to high electrical fields. A better protection of the gate-dielectric regions enables proper operation of said transistors also at higher operating voltages, without jeopardizing reliability thereof.

In particular, silicon carbide MOSFETs may be made in such a way that they have a planar structure or a trench-gate structure. Planar-structure transistors typically have a lower channel mobility than trench-gate transistors.

An example of trench silicon carbide MOSFET of a known type (referred to hereinafter for simplicity as "device 1") is provided in FIG. 1, where it is represented in lateral sectional view in a system of spatial co-ordinates defined by mutually orthogonal axes X, Y, and Z.

The device 1 comprises a semiconductor body 2 made of silicon carbide.

In particular, the semiconductor body 2 comprises a substrate 4 and a structural region 6. The substrate 4 is made of silicon carbide having a conductivity of a first type (here, an N type) and a first doping concentration. The substrate 4 is delimited by a first side 4a and a second side 4b opposite to one another in the direction Z.

The structural region 6 is likewise made of silicon carbide, having a conductivity of the first type (N) and a second doping concentration lower than the first doping concentration. The structural region 6 extends over the substrate 4 and is delimited by a first side 6a and a second side 6b, which is opposite to the first side 6a in the direction Z and is in contact with the substrate 4 on its first side.

A body region 8, having a conductivity of a second type (here a P type), different from the first type, extends within the structural region 6, with main direction of extension substantially parallel to the plane XY.

A source region 10, having a conductivity of the first type (N), extends on the body region 8, with main direction of extension parallel to the plane XY. In particular, a first side of the source region 10 is in contact with the body region 8, whereas a second side of the source region 10, opposite to the first side in the direction Z, coincides with the first side 6a of the structural region 6.

A first gate region 12a extends in depth within the structural region 6, starting from its first side 6a. In particular, the first gate region 12a traverses entirely the source region 10 and the body region 8, and extends in depth beyond the body region 8.

A second gate region 12b, equivalent from a structural and functional standpoint to the first gate region 12a, extends in depth within the structural region 6, starting from its first side 6a, at a distance from the first gate region 12a. As has been said for the first gate region 12a, the second gate region 12b traverses entirely the source region 10 and the body region 8 and extends in depth beyond the body region 8.

The first and second gate regions 12a, 12b, comprise, respectively, a first gate electrode 12a' and a second gate electrode 12b', made of conductive material. Moreover, the first and second gate regions 12a, 12b comprise, respectively, a first gate dielectric 12a" and a second gate dielectric 12b", made of insulating material.

In particular, the first and second gate dielectrics 12a", 12b" coat the first and second gate electrodes 12a', 12b' in such a way that the first and second gate electrodes 12a', 12b' are not in direct contact with the source region 10, the body region 8, and the structural region 6.

During use of the device 1, in a known way, conductive channels are formed at the interface between the body region 8 and, respectively, the first and second gate dielectrics 12a", 12b".

A shielding region 14, having a conductivity of the second type (P), extends within the structural region 6, at a distance from the first and second gate regions 12a, 12b, on a respective side of the latter. More in particular, the shielding region 14 does not extend between the first and second gate regions 12a, 12b. The shielding region 14 extends in depth starting from the first side 6a of the structural region 6, reaching a depth greater than that of the body region 8.

The device 1 further comprises an intermediate dielectric region 18, which extends, at the first side 6a of the structural region 6, over the source region 10, the first and second gate regions 12a, 12b, and the shielding region 14. In particular, the intermediate dielectric region 18 covers the first and second gate regions 12a, 12b entirely.

The device 1 further comprises a source electrode 20, which extends over the intermediate dielectric region 18 and within openings in the intermediate dielectric region 18, at regions of the first side 6a of the structural region 6 not covered by the intermediate dielectric region 18.

The device 1 further comprises a drain electrode 22, which extends underneath the semiconductor body 2.

A contact region 16, having a conductivity of the first type (N+) and a third doping concentration higher than the second doping concentration, extends between, and at a distance from, the first and second gate regions 12a, 12b, in depth in the structural region 6 starting from the first side 6a. In particular, the depth, along Z, at which the contact region 16 extends corresponds to the depth at which the source region 10 extends.

A central implantation region 24, having a conductivity of the second type (P), extends between the first and second gate regions 12a, 12b, and at a distance from the latter, within the structural region 6 and immediately underneath the contact region 16 and the source region 10. In particular, the central implantation region 24 extends in depth in the structural region 6, beyond the depth, measured along the axis Z, reached by the body region 10.

In particular, the central implantation region 24 extends at a first distance $TTP_L$ from the first gate region 12a, and at a second distance $TTP_R$ from the second gate region 12b, the first and second distances $TTP_L$, $TTP_R$ being the minimum distances between the central implantation region 24 and the first and second gate regions 12a, 12b measured in the direction X.

Likewise, also the shielding regions 14 extend at respective minimum distances $TTP_L{}'$ and $TTP_R{}'$ from the respective first and second gate regions 12a, 12b that they face directly.

As is known, the shielding region 14 and the central implantation region 24 are designed so as to reduce, given the same reverse-biasing voltage applied, the electrical field at the first and second gate dielectrics 12a", 12b". In effect, an aim in design of the device 1 consists in guaranteeing that the first and second gate dielectrics 12a", 12b" will be able to withstand the electrical fields in any operating condition.

For this purpose, there is known the possibility of increasing the thickness of the first and second gate dielectrics 12a", 12b". However, this design solution entails an undesirable increase in the extension in the plane XY of the area of the first and second gate regions 12a, 12b, thus limiting the efficiency of the device 1 and increasing the area occupied thereby.

It is moreover known that the efficiency of the central implantation region 24 in limiting the electrical field at the first and second gate dielectrics 12a", 12b" depends, respectively, upon the values of the first and second distances $TTP_L$, $TTP_R$, as well as upon the values of the distances $TTP_L{}'$ and $TTP_R{}'$. In particular, it is known that the distances $TTP_L$, $TTP_R$, $TTP_L{}'$, and $TTP_R{}'$ should preferably be comprised in a range around an ideal value. However, a possible drawback of this solution applied to the device 1 is caused by the methods typically used for manufacturing the device 1. In particular, it is common to produce the first and second gate regions 12a, 12b using a first photolithographic mask, whereas the central implantation region 24 and the shielding regions 14 are obtained using one and the same second photolithographic mask, or successive second photolithographic masks. Consequently, any inevitable imprecision of alignment between the first and the one or more second photolithographic masks mean that the distances $TTP_L$, $TTP_R$, $TTP_L{}'$, and $TTP_R{}'$ are, in effect, all different from one another, thus unbalancing the electrical behavior of the device 1. In particular, the resulting asymmetry means that one of the first and second gate dielectrics 12a", 12b" is subjected to a stronger electrical field given the same operating voltage, hence causing a lower breakdown voltage for the device 1. Added to this is a degradation of the gate oxide, which jeopardizes the reliability during the service life of the device 1.

BRIEF SUMMARY

One or more embodiments of the present disclosure provide a silicon carbide MOSFET device with low on-state resistance and high reliability, and a manufacturing method thereof, alternative to those of a known type. Such one or more embodiments provide a MOSFET device and a method for manufacturing the MOSFET device that will be able to overcome or reduce the drawbacks of the prior art mentioned previously.

According to the present disclosure a MOSFET device and a method for manufacturing the MOSFET device are provided.

BRIEF DESCRIPTION OF THE SEVERAL VIEWS OF THE DRAWINGS

For an understanding of the present disclosure, preferred embodiments thereof are now described, purely by way of non-limiting example, with reference to the attached drawings, wherein.

DETAILED DESCRIPTION

Figure 1:
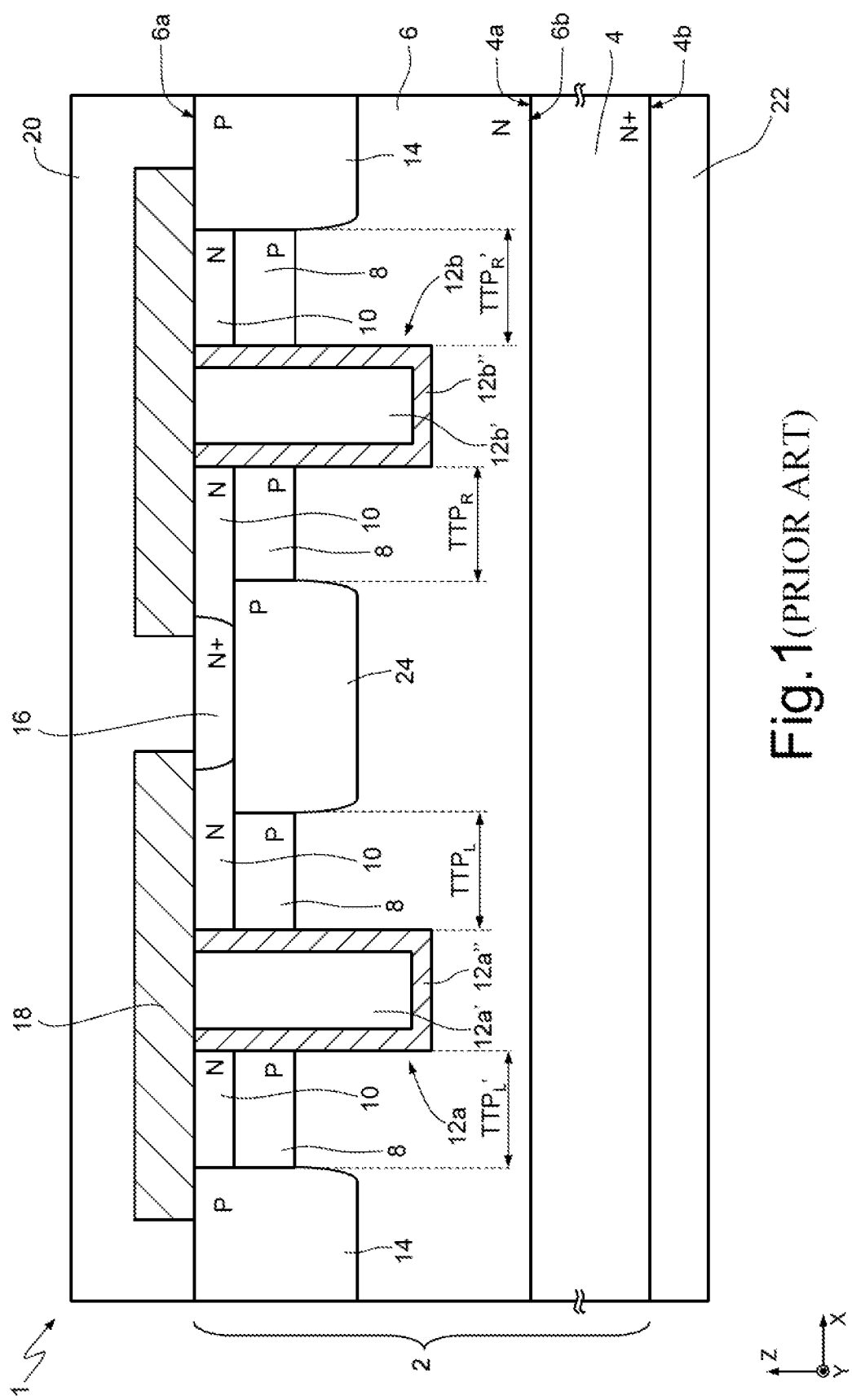
FIG. 1 is a schematic lateral sectional view of a MOSFET device of a known type.
Figure 2:
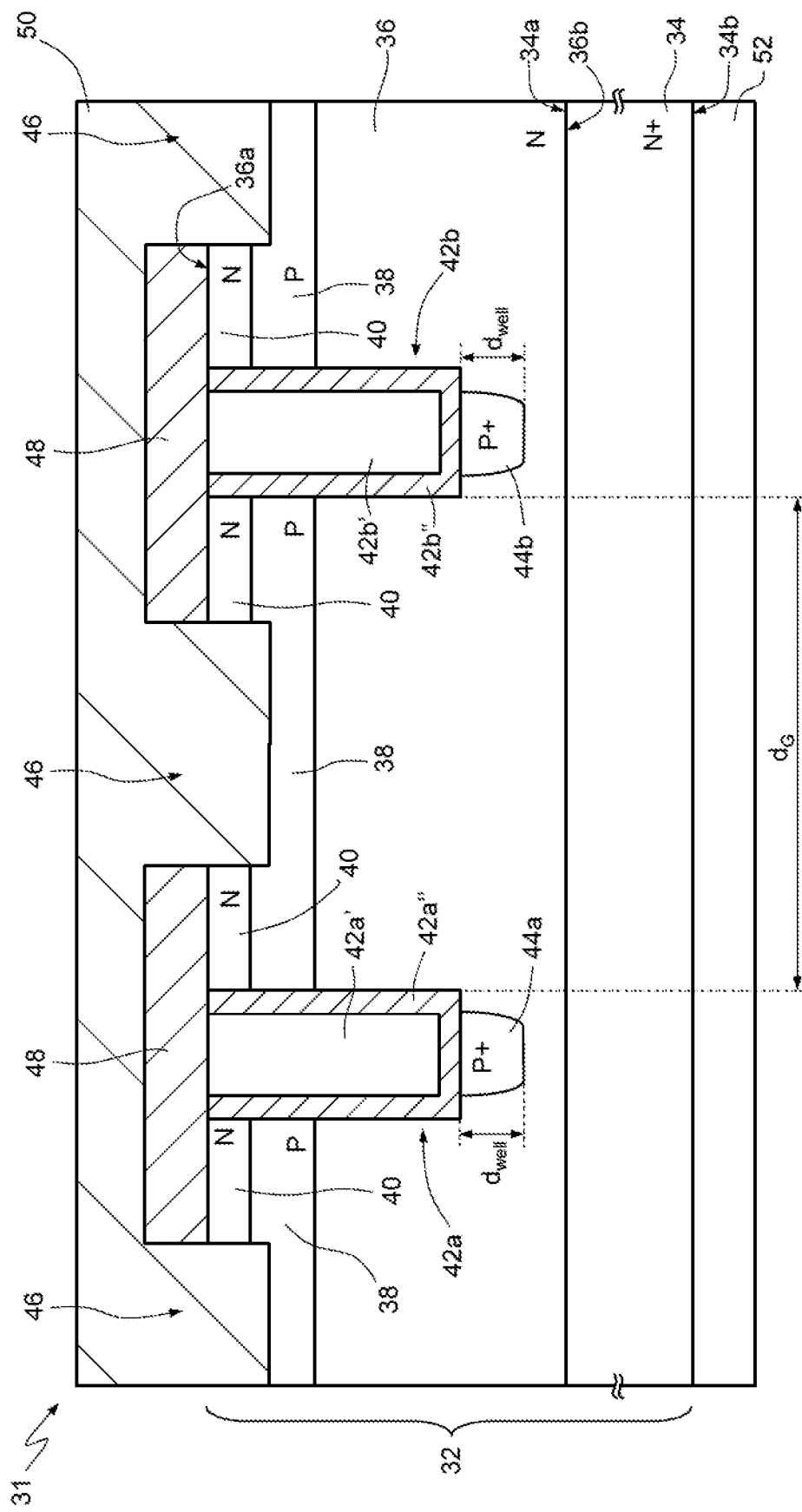
FIG. 2 is a schematic lateral sectional view of a MOSFET device according to an embodiment of the present disclosure.

FIG. 2 is a schematic illustration of a trench-gate MOSFET 31 according to an embodiment of the present disclosure. For simplicity, in the rest of the description, it will be referred to as "MOSFET device 31". The MOSFET device 31 is illustrated in lateral sectional view in a system of spatial co-ordinates defined by mutually orthogonal axes X, Y, and Z.

The MOSFET device 31 comprises a semiconductor body 32 made of silicon carbide. The semiconductor body 32 comprises a substrate 34 and a structural body 36. The substrate 34 is made of a semiconductor material, for example silicon carbide SiC, having a conductivity of a first type (here, an N type) and a first doping concentration, for example, higher than $10^{18}$ atoms/cm³. The substrate 34 is delimited by a first side 34a and a second side 34b opposite to one another in the direction Z.

The structural body 36 likewise may be made of silicon carbide, extends over the substrate 34, and is delimited by a first side 36a and by a second side 36b, which is opposite to the first side 36a in the direction Z. In particular, the second side 36b of the structural body 36 coincides with the first side 34a of the substrate 34. The structural body 36 has a thickness, measured in the direction Z, comprised, for example between 1 μm and 100 μm, for example 10 μm, for withstanding, in use, voltages of between 100 V and 20 kV.

A body region 38, having a conductivity of a second type (here a P type), different from the first type, extends within the structural body 36 starting from its first side 36a and in depth along Z. In particular, the body region 38 has a doping concentration comprised, for example, between $10^{15}$ atoms/cm³ and $10^{18}$ atoms/cm³, for example $10^{17}$ atoms/cm³, for withstanding, in use, voltages of between 100 V and 20 kV.

A source region 40, having a conductivity of the first type (N), extends within the body region 38 starting from the first side 36a of the structural body 36. In particular, the source region 40 has a doping concentration comprised, for example, between $10^{18}$ atoms/cm³ and $10^{21}$ atoms/cm³, for example $10^{20}$ atoms/cm³.

In particular, the source region 40 extends within the structural body 36 down to a maximum depth comprised, for example, between 0.1 μm and 0.5 μm, for example 0.3 μm, where said depth is considered in the direction Z starting from the first side 36a of the structural body 36. The body region 38 extends within the structural body 36 down to a depth comprised, for example, between 0.3 μm and 1 μm, for example 0.6 μm, considered in the direction Z starting from the first side 36a of the structural body 36.

The portions of the structural body 36 not occupied by the body region 38 and the source region 40 have a conductivity of the first type (N) and a second doping concentration lower than the first doping concentration, for example of between $10^{14}$ atoms/cm³ and $10^{17}$ atoms/cm³, for example $10^{16}$ atoms/cm³. In practice, the concentration of dopant species of the structural body 36 may be chosen in such a way as to bestow on the latter a resistivity of between 6.25 Ω·cm and 0.125 Ω·cm.

A first gate region 42a extends in depth within the structural body 36, starting from its first side 36a. In particular, the first gate region 42a traverses entirely the source region 40 and the body region 38, and extends beyond the body region 38 down to a depth comprised, for example, between 0.4 μm and 10 μm, for example 1.5 μm, terminating within the structural body 36.

A second gate region 42b, structurally and functionally similar to the first gate region 42a, extends in depth within the structural body 36, starting from its first side 36a in a main direction substantially parallel to the axis Z. The first and second gate regions 42a, 42b are at a distance from one another. As has been said for the first gate region 42a, the second gate region 42b traverses entirely the source region 40 and the body region 38, and extends beyond the body region 38 reaching the same depth as the first gate region 42a, and terminating within the structural body 36.

In particular, the first and second gate regions 42a, 42b are at a distance $d_G$ from one another comprised, for example, between 1 μm and 5 μm, for example 2 μm. This distance $d_G$ is the minimum distance, measured in the direction X, between the first and second gate regions 42a, 42b.

The first and second gate regions 42a, 42b comprise, respectively, a first gate electrode 42a' and a second gate electrode 42b', made of conductive material such as doped polysilicon, and a respective first gate dielectric 42a" and second gate dielectric 42b", made of insulating material such as silicon dioxide ($SiO_2$).

In particular, the first and second gate dielectrics 42a", 42b" surround or coat, respectively, the first and second gate electrodes 42a', 42b' in such a way that the first and second gate electrodes 42a', 42b' are not in direct contact with the source region 40, the body region 38, and the structural body 36. In other words, the first and second gate dielectrics 42a", 42b" electrically insulate the first and second gate electrodes 42a', 42b' from the source region 40, from the body region 38, and from the structural body 36.

By way of example, the first and second gate dielectrics 42a", 42b" have a thickness comprised, for example, between 10 nm and 150 nm, for example, 50 nm.

In a way in itself known, during use of the device 31 conductive channels are formed at the interface between the body region 38 and, respectively, the first and second gate dielectrics 42a", 42b".

According to one aspect of the present disclosure, a first shielding region 44a and a second shielding region 44b, having a conductivity of the second type (P+), extend underneath the first and second gate regions 42a, 42b, respectively, in contact with the first and second gate dielectrics 42a", 42b", respectively, at the bottom of the respective gate region 42a, 42b.

In particular, the first and second shielding regions 44a, 44b extend within the structural body 36, without reaching the substrate 34. In particular, the first and second shielding regions 44a, 44b extend down to a depth $d_{well}$ comprised, for example, between 0.1 μm and 0.3 μm, for example 0.2 μm, where said depth is measured in the direction Z starting from the interface with the bottom of the respective gate region 42a, 42b.

The first and second shielding regions 44a, 44b have a doping concentration comprised between $10^{17}$ atoms/cm$^3$ and $10^{21}$ atoms/cm$^3$, for example $10^{20}$ atoms/cm$^3$. According to one aspect of the present disclosure, the concentration of dopant species of the first and second shielding regions 44a, 44b is chosen so as to bestow thereon a resistivity of between $2.5·10^{-1}$ Ω·cm and $6.5·10^{-3}$ Ω·cm.

According to one aspect of the present disclosure, the first and second shielding regions 44a, 44b are aligned, in the direction Z, with the first and second gate regions 42a, 42b, respectively. In particular, in a top plan view in the plane XY (not illustrated in the figures), the first shielding region 44a extends over an area equal to or greater than the area of extension of the first gate electrode 42a', but smaller than the area of extension of the first gate dielectric 42a". This may also apply to the alignment between the second gate region 42b and the second shielding region 44b. In other words, the first and second shielding regions 44b extend exclusively underneath the first and second gate regions 42a, 42b, respectively.

According to one aspect of the present disclosure, the presence of the first and second shielding regions 44a, 44b enables reduction of the electrical field, during use of the MOSFET device 31, in the proximity of the first and second gate dielectrics 42a", 42b", thus improving the reliability of the MOSFET device 31.

Moreover, thanks to the alignment between the first and second gate regions 42a, 42b and the respective first and second shielding regions 44a, 44b, and in particular thanks to the fact that the first and second shielding regions 44a, 44b do not project outside the respective first and second gate regions 42a, 42b, the first and second shielding regions 44a, 44b do not interfere with the conductive channels, and consequently the on-state resistance of the MOSFET device 31 is not inconveniently increased.

The MOSFET device 31 further comprises an intermediate dielectric region 48, which extends, at the first side 36a of the structural body 36, over the source region 40 and over the first and second gate regions 42a, 42b. In particular, the intermediate dielectric region 48 covers entirely the first and second gate regions 42a, 42b. In particular, the intermediate dielectric region 48 is made of insulating material, such as TEOS, and has a thickness comprised, for example, between 0.2 μm and 2 μm, for example 0.5 μm.

Contact regions (trenches) 46 extend alongside each intermediate dielectric region 48, completely through the source region 40 and partially through the body region 38, terminating within the latter. In one embodiment, the trenches 46 have an extension, in top view in the plane XY, that is continuous along the axis Y.

In a different embodiment (not illustrated), each trench 46 has an extension, in top view in the plane XY, of a discontinuous type, including trench sub-portions aligned along the axis Y and alternating with full regions. This embodiment presents the advantage of maximizing the area of contact with the source region 40. In a further embodiment (not illustrated either), the MOSFET device 31 does not have trenches 46. In this case, the electrical contact with the body region 38 occurs by means of implanted regions, having the second type of conductivity (P), which extend through the source regions 40 until they reach and contact the underlying body regions 38. The shape and extension of said implanted regions substantially replicates the shape and extension described for the trenches 46 in the context of the present disclosure (for example, they have an extension, in top view in the plane XY, of a discontinuous type, including implanted sub-portions aligned along the axis Y alternating with regions in which the implant is absent).

The MOSFET device 31 further comprises a source electrode 50, made of conductive material, which extends over the intermediate dielectric region 48 and within the contact regions 46. The source electrode 50 is hence in electrical contact with the source regions 40 and with the body regions 38. Each contact region 46 extends at a distance from the first and second gate regions 42a, 42b in such a way that the source electrode 50 is in direct electrical contact with the source region 40 and the body region 38, but is not in direct electrical contact with the first and second gate regions 42a, 42b. In particular, the contact region 46 extends in a central position between the first and second gate regions 42a, 42b, and outside the area between the first and second gate regions 42a, 42b. In other words, the contact region 46 extends outside each gate region 42a, 42b, giving out on opposite sides in the direction X of each gate region 42a, 42b.

In particular, the extension of the first and second gate regions 42a, 42b and of the source electrode 50 through the source region 40 means that the source region 40 comprises a plurality of subregions, amongst which: a first source subregion between the source electrode 50 and a first side of the first gate dielectric 42a"; a second source subregion between the source electrode 50 and a second side of the first gate dielectric 42a", opposite to the first side in the direction X; a third source subregion between the source electrode 50 and a first side of the second gate dielectric 42b"; a fourth source subregion between the source electrode 50 and a second side of the second gate dielectric 42b", opposite to the first side in the direction X. In other words, each gate region 42a, 42b is interposed between two source subregions.

The MOSFET device 31 further comprises a drain electrode 52, made of conductive material, which extends on the back of the semiconductor body 32, i.e., on the second side 34b of the substrate 34.

The steps for manufacturing the MOSFET device according to the present disclosure are described in what follows with reference to FIGS. 3A-3F. FIGS. 3A-3F illustrate, in lateral sectional view in the plane XZ, the MOSFET device in the system of spatial co-ordinates X, Y, and Z of FIG. 2.

Figure 3A:
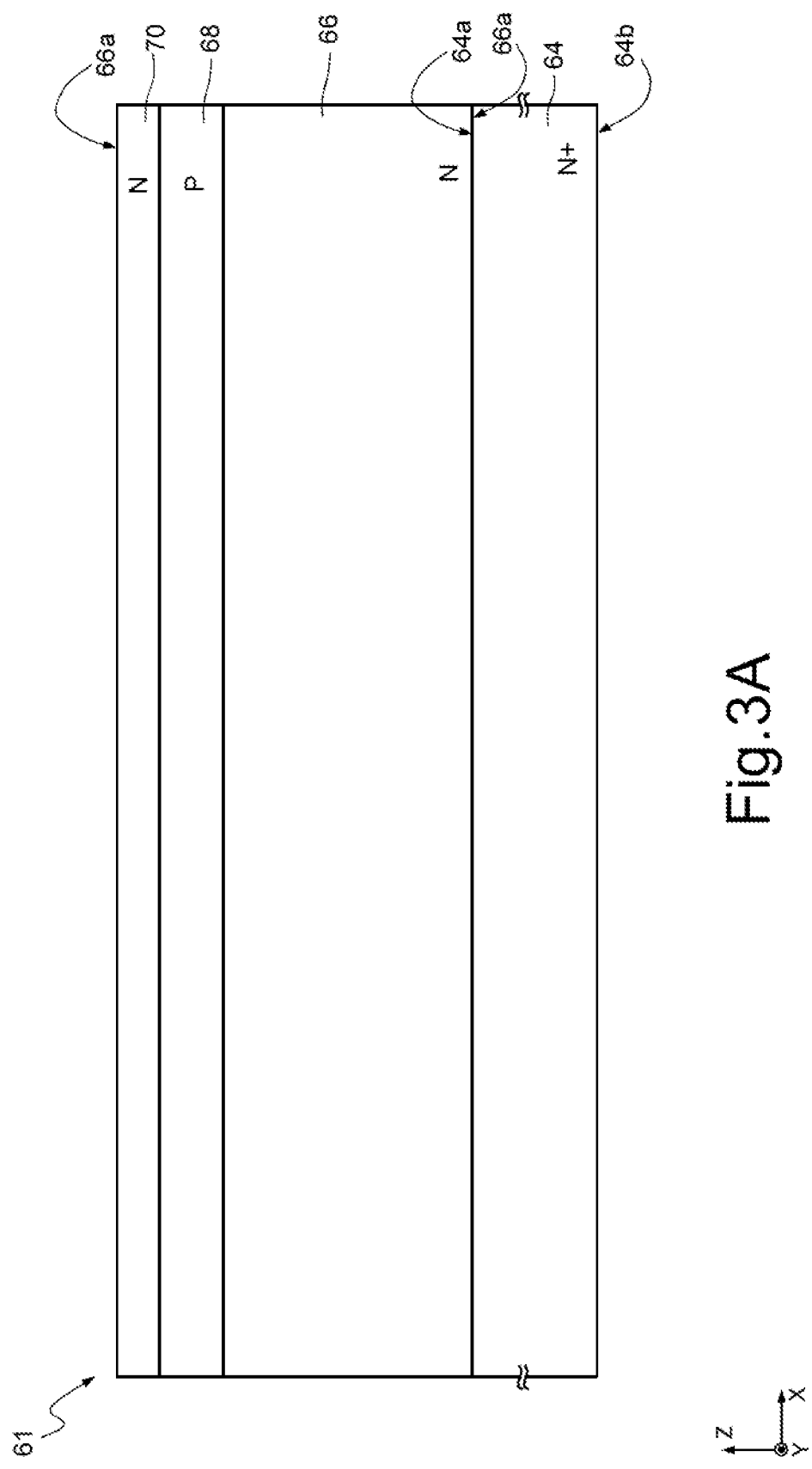
FIGS. 3A-3F are schematic lateral sectional views of respective manufacturing steps of a MOSFET device according to an embodiment of the present disclosure.

FIG. 3A illustrates a portion of a wafer 61 comprising a substrate 64, in particular made of silicon carbide having a conductivity of a first type (here, an N type) and a first doping concentration, for example higher than $10^{18}$ atoms/$cm^3$. The substrate 64 is delimited by a first side 64a and by a second side 64b opposite to one another in the direction Z.

On top of the substrate 64 a structural layer 66 is formed, for example, by of epitaxial growth of silicon carbide on the first side 64a of the substrate 64. The epitaxial growth is carried out according to known techniques and in such a way that the structural layer 66 has the first type of conductivity (N) and a second doping concentration lower than the first doping concentration, comprised, for example, between $10^{14}$ atoms/$cm^3$ and $10^{17}$ atoms/$cm^3$, for example $10^{16}$ atoms/$cm^3$. Moreover, the epitaxial growth is carried out until a thickness of the structural layer 66 comprised, for example, between 1 μm and 100 μm, for example 10 μm is reached. The structural layer 66 is delimited by a first side 66a and a second side 66b, opposite to one another in the direction Z; in particular, the second side 66b coincides with the first side 64a of the substrate 64.

Then, using implantation techniques in a way in itself known, a body layer is formed 68 having a conductivity of a second type (here a P type), in particular by means of implantation of dopant ion species of a P type, for example aluminum, on the first side 66a of the structural layer 66. In particular, the implantation dose is, by way of example, of between $10^{12}$ and $10^{13}$ atoms/$cm^3$ and the implantation energies are comprised, by way of example, between 150 keV and 700 keV, so as to reach a depth, measured in the direction Z starting from the first side 66a of the structural layer 66, of between, for example, 0.1 μm and 1 μm, for example 0.6 μm.

Then, using implantation techniques of a type in itself known, a source layer is formed 70 having a conductivity of the first type (here, an N type), in particular by means of implantation of dopant ion species of an N type, such as nitrogen or phosphorous, on the first side 66a of the structural layer 66. In particular, the implantation dose is by way of example of between $10^{13}$ and $10^{15}$ atoms/$cm^3$ and the implantation energies are comprised, by way of example, between 50 keV and 300 keV, so as to reach a depth less than the depth reached by the body layer 68 and comprised, for example, between 0.1 μm and 0.5 μm, for example 0.3 μm.

As an alternative to what has been described, the body layer 68 and the source layer 70 may be formed by means of subsequent epitaxial growths of material (here, SiC) appropriately doped.

This is followed (FIG. 3B) by a step of selective etching of the structural layer 66 by means of photolithographic and etching techniques of a type in itself known, using a mask 72 formed on the first side 66a of the structural layer 66. In particular, the mask 72 is made of insulating material such as TEOS or silicon nitride ($Si_3N_4$), and has openings 72a in the areas in which the first and second gate regions 42a, 42b of the MOSFET device 31 of FIG. 2 are to be formed, in subsequent processing steps.

Figure 3B:
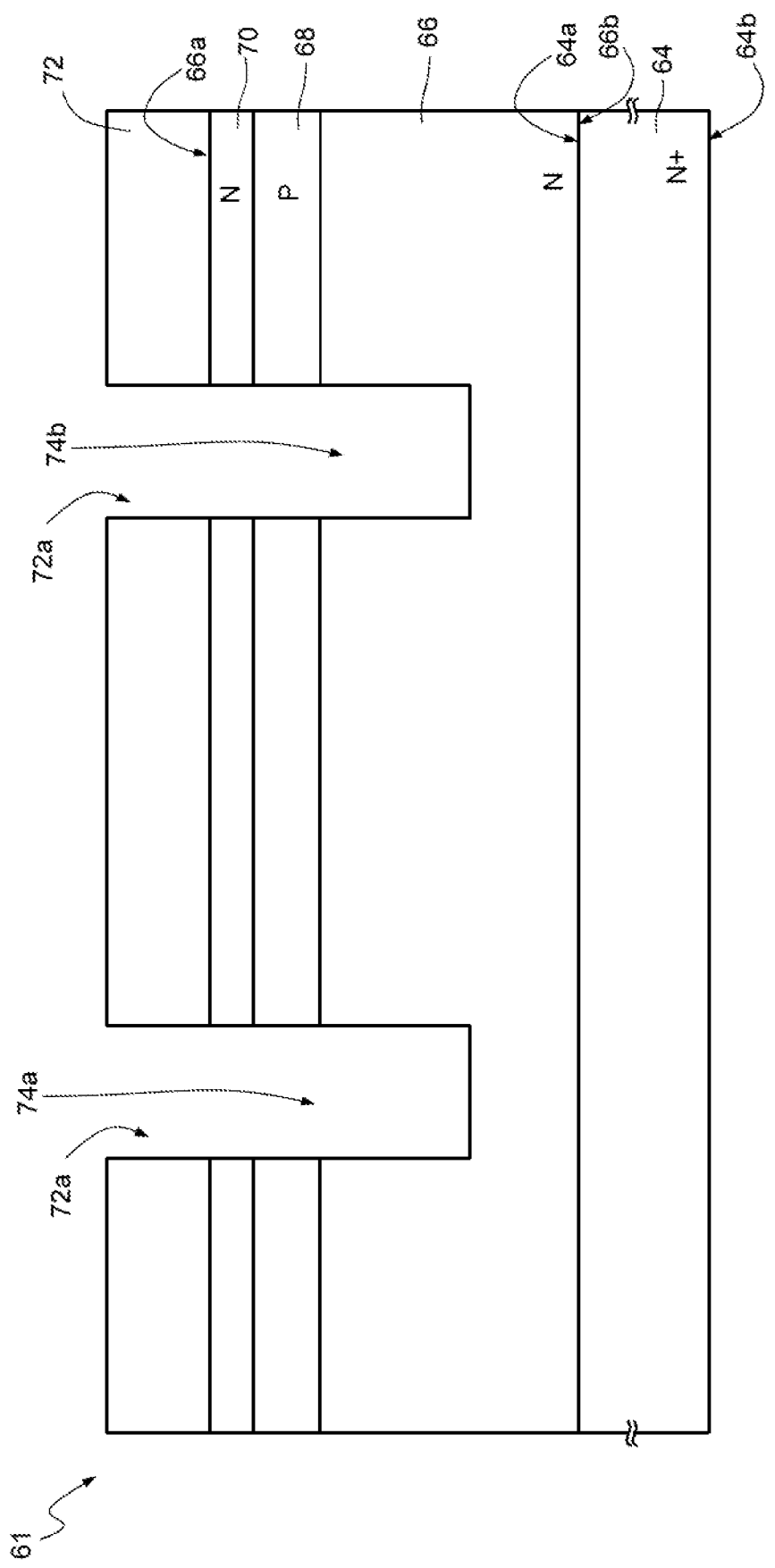
Figure 3C:
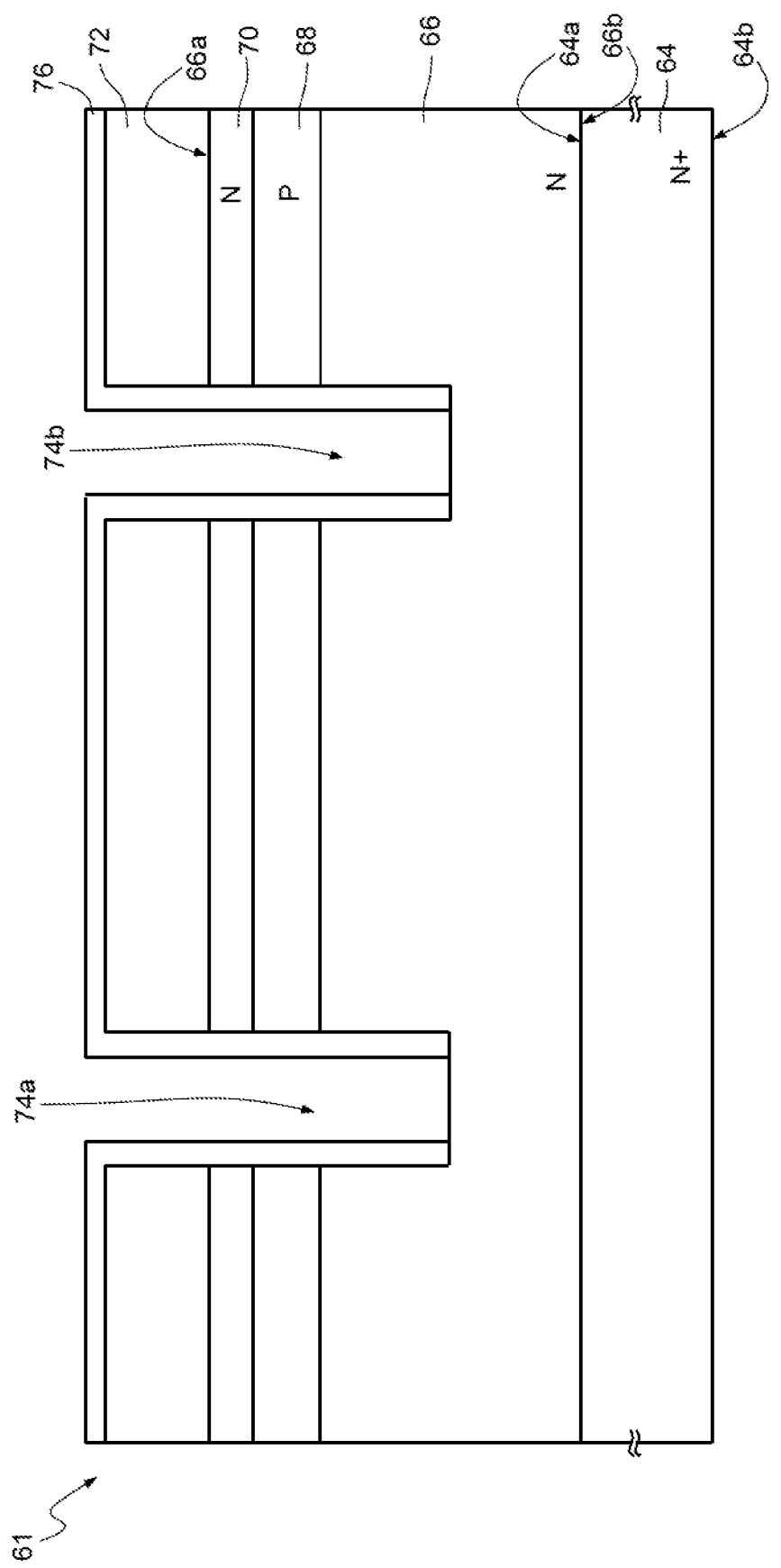
Figure 3D:
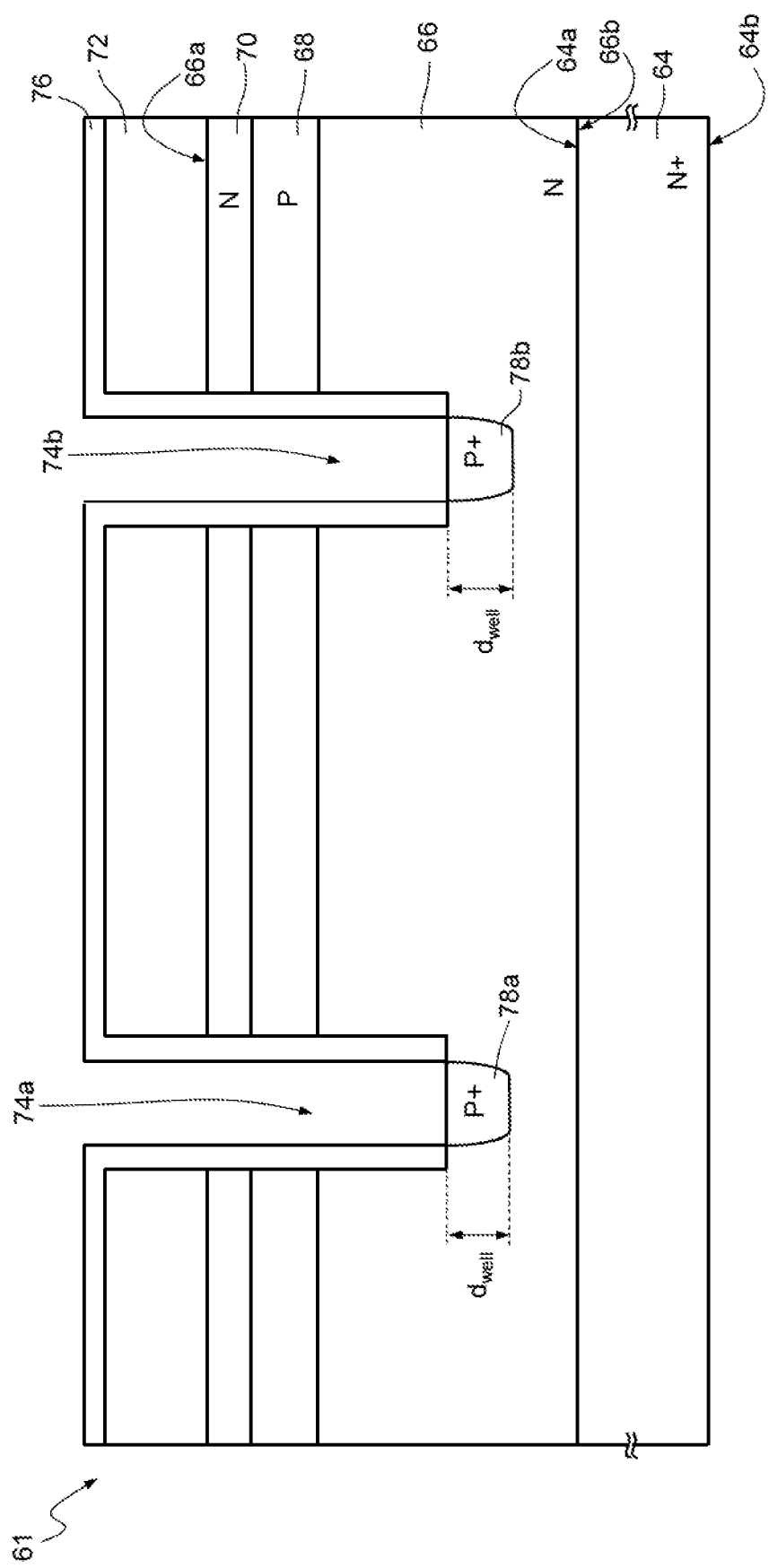
Figure 3E:
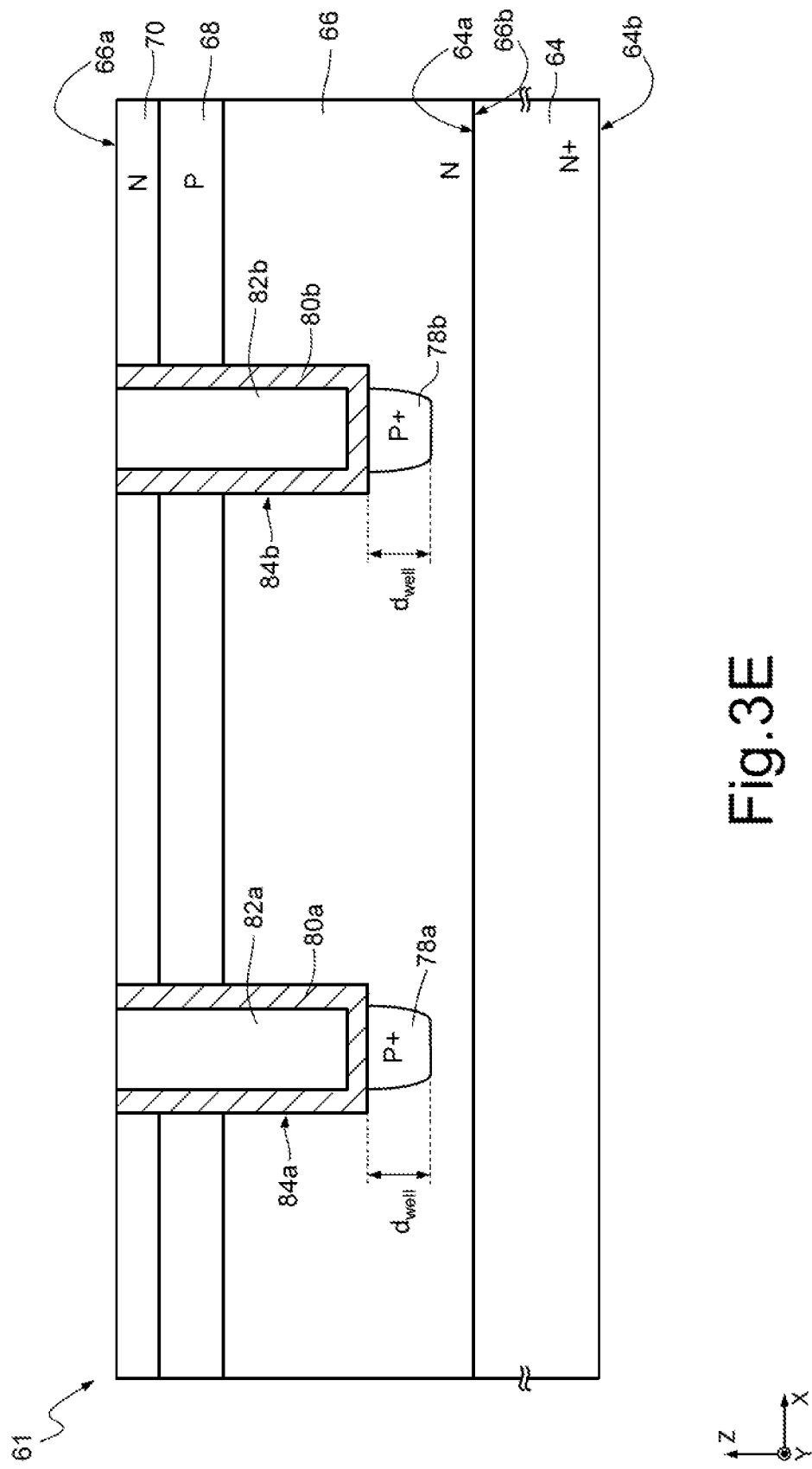

The step of etching through the mask 72, illustrated in FIG. 3B, forms a plurality of trenches in the structural layer 66 at the openings 72a of the mask 72. In particular, the etching step forms a first trench 74a and a second trench 74b. In particular, the etching step proceeds for a time necessary for the first and second trenches 74a, 74b to pass completely through the source layer 70 and the body layer 68. In particular, the depth, along Z, of the first and second trenches 74a, 74b is comprised, for example, between 0.4 μm and 10 μm, for example 1.5 μm. The trenches 74a, 74b have a width, measured along the axis X, comprised, for example, between 0.5 μm and 1 μm, for example 0.6 μm. The extension along the axis Y of the trenches 74a, 74b is equal to the extension of the active area.

This is followed (FIG. 3C) by formation of a spacer layer 76 made of insulating material, such as TEOS or $Si_3N_4$, on top of the mask 72 and within the first and second trenches 74a, 74b, filling them partially. In particular, the spacer layer 76 is formed by growth or deposition in a conformable way within the first and second trenches 74a, 74b and extends both on the bottom of the trenches and on the side walls. Even more in particular, subsequent to the step of formation of the spacer layer 76, the structural layer 66 is completely covered.

This is followed by a step of etching of the spacer layer 76, in a selective way with respect to the structural layer 66, in order to expose the structural layer 66 at the bottom of the first and second trenches 74a, 74b. According to one aspect of the present disclosure, said etching step is carried out in such a way that, at the end thereof, the spacer layer 76 continues to cover the side walls of the first and second trenches 74a, 74b completely, but not the bottom of the first and second trenches 74a, 74b. In particular, the steps of formation and non-masked etching of the spacer layer 76 are designed according to known techniques in such a way that at the end of the etching step, the thickness of the spacer layer 76 at the side walls of the first and second trenches 74a, 74b is comprised, for example, between 50 nm and 300 nm, for example 100 nm, where said thickness is measured in the direction X. By way of example, said etching step is of an anisotropic dry type (e.g., RIE), preferably acting in the direction Z, in such a way that the rate of removal of the spacer layer 76 at the bottom of the trenches 74a, 74b is higher than the rate of removal of the spacer layer 76 at the side walls of the trenches 74a, 74b.

This is followed (FIG. 3D) by a step of formation of the shielding regions 44a, 44b of FIG. 2. For this purpose, an ion implantation of dopant impurities, for example aluminum, is carried out in order to form a first implanted region 78a and a second implanted region 78a78b having a conductivity of the second type (P+) on the bottom of the first and second trenches 74a, 74b, respectively. In particular, during the implantation step, the mask 72 and the spacer layer 76 function as implantation mask, preventing penetration of dopant impurities within the structural layer 66 except for the region at the bottom of the first and second trenches 74a, 74b.

In particular, the implantation dose is, by way of example, of between $10^{13}$ and $10^{15}$ atoms/cm$^3$ and the implantation energies are comprised, by way of example, between 10 keV and 80 keV.

A subsequent step of thermal diffusion completes formation of the shielding regions 44a, 44b.

In particular, the implantation step is designed in such a way that the first and second shielding regions 78a, 78b extend for a depth $d_{well}$ of between 100 nm and 300 nm, for example 200 nm, where the depth is measured in the direction Z starting from the bottom of the first and second trenches 74a, 74b.

According to one aspect of the present disclosure, the presence of the spacer layer 76 on the side walls of the first and second trenches 74a, 74b means that, at the end of the implantation step, the first and second shielding regions 78a, 78b do not extend, in top plan view in the plane XY, outside the area in which the first and second trenches 74a, 74b had previously been formed.

The first and second shielding regions 44a, 44b of the MOSFET device 31 of FIG. 2 are thus formed.

This is followed (FIG. 3E) by a step of wet etching of the mask 72 and of the spacer layer 76, selectively with respect to the structural layer 66, in order to remove completely the mask 72 and the spacer layer 76 both on top of the structural layer 66 and within the first and second trenches 74a, 74b.

Next, the first and second trenches 74a, 74b are filled with a gate-dielectric layer and a gate-metallization layer, in a way in itself evident to the person skilled in the art.

In particular, the gate-dielectric layer, made of insulating material, such as $SiO_2$, $Al_2O_3$, $HfO_2$, is deposited on the structural layer 66, on its first side 66, and inside the first and second trenches 74a, 74b.

In particular, the gate-dielectric layer is formed by growth or deposition in a conformable way within the first and second trenches 74a, 74b and extends both on the bottom of the trenches and on the side walls. In other words, subsequent to the step of formation of the gate-dielectric layer, the structural layer 66 is completely covered.

In particular, the gate-dielectric layer has a thickness comprised, for example, between 10 nm and 200 nm, for example 50 nm, so as to fill the first and second trenches 74a, 74b only partially.

Then, the gate-metallization layer is deposited so as to fill the first and second trenches 74a, 74b and is subsequently patterned by means of an etching step to form respective gate electrodes 82a, 82b. The first and second gate electrodes 42a', 42b' are thus formed, and consequently the first and second gate regions 42a, 42b of the MOSFET device 31 of FIG. 2, designated, respectively, by the reference numbers 84a, 84b in FIG. 3E.

Next (FIG. 3F), an intermediate dielectric layer 86 is formed on the first side 66a of the structural layer 66, on top of the source layer 70. In particular, the intermediate dielectric layer 86 covers the first and second gate regions 84a, 84b entirely. In particular, the intermediate dielectric layer 86 is made of insulating material, such as TEOS, and has a thickness comprised, for example, between 0.2 μm and 2 μm, for example 0.5 μm.

Then, an etching step is carried out aimed at forming a plurality of trenches 88 in the structural layer 66 on its first side 66a. In particular, the trenches 88 extend on opposite sides in the direction X of each between the first and second gate regions 84a, 84b. In particular, the etching step starts with an etch of the intermediate dielectric layer 86, and then extends throughout the thickness of the source layer 70 and partially into the body layer 68. In other words, the trenches 88 extend at a distance from the first and second gate regions 84a, 84b, in regions where it is intended to form the contact regions 46 of the MOSFET device 31 of FIG. 2. The intermediate dielectric region 48 and the source subregions of the source region 40 of the MOSFET device 31 of FIG. 2 are thus formed.

Figure 3F:
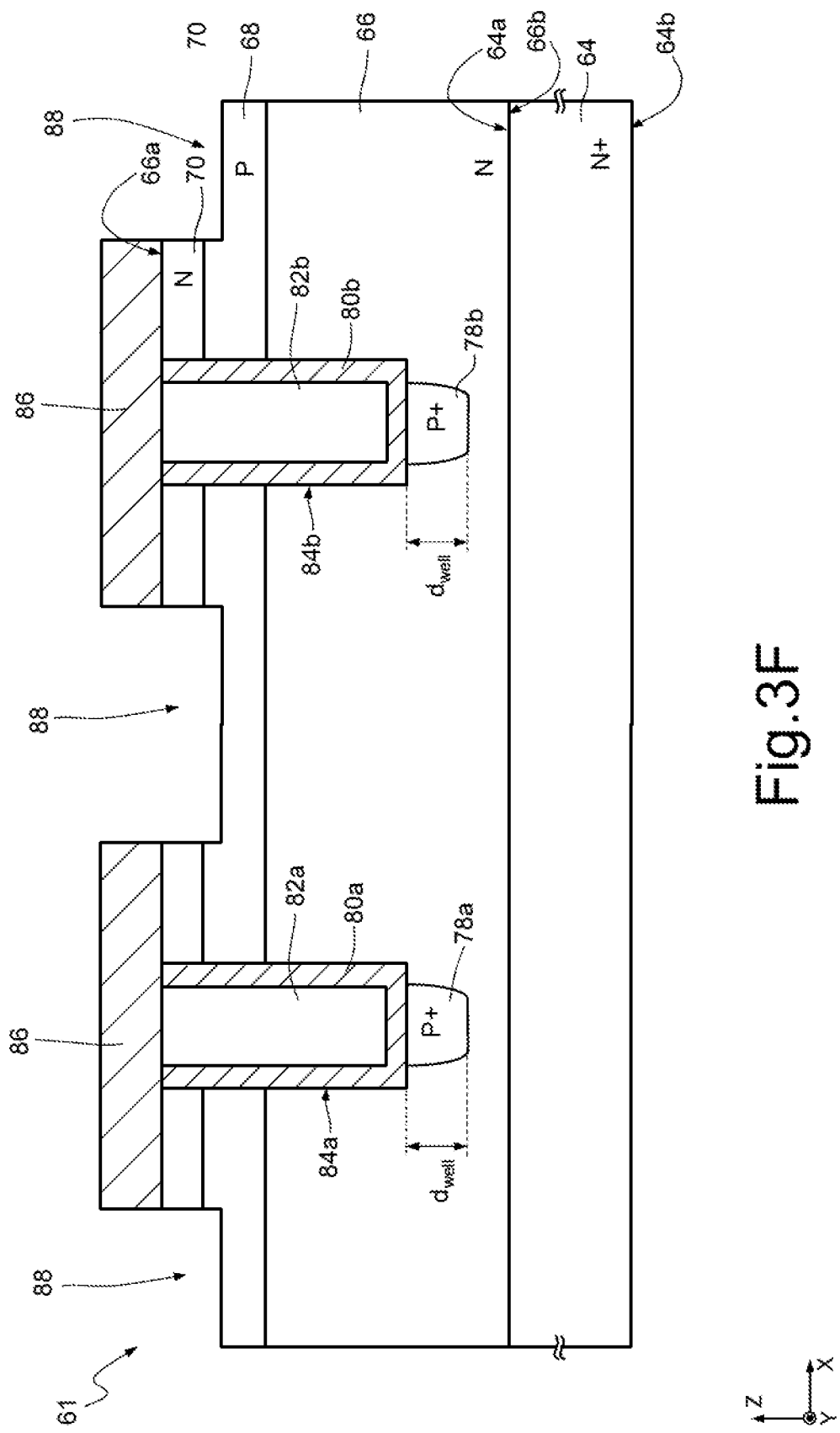

Next, in a way not illustrated in FIG. 3F, a source metallization is formed by depositing conductive material on the wafer 61 in such a way that it fills the trenches 88 completely and extends over the intermediate dielectric layer 86.

Finally, in a way not illustrated in FIG. 3F, a drain metallization is formed by depositing conductive material on the opposite side of the wafer 61, in contact with the substrate 64.

In this way, the MOSFET device 31 of FIG. 2 is formed.

From an examination of the characteristics of the present disclosure, the advantages that it affords are evident.

In particular, the presence of the shielding regions at the bottom of the trench-gate regions means that the gate dielectrics are subject to electrical fields of lower intensity. Consequently, the MOSFET device can operate at higher voltages without being damaged. The reliability of the MOSFET device is thus improved.

Moreover, the fact that the manufacturing method is based upon a self-alignment of each gate region to the respective shielding region means that no shielding region projects alongside the respective gate region, interfering with the respective conductive channel. Consequently, the properties of conduction of the MOSFET device are not adversely affected by the presence of the shielding regions. In particular, the on-state resistance is not increased.

In addition, the fact that the manufacturing method is based upon a self-alignment of each gate region to the respective shielding region means that it is possible to reduce the distance between the gate regions, thus favoring miniaturization of the MOSFET device.

The problems of unbalancing of the electrical behavior of the device, identified with reference to the prior art, are moreover overcome.

Finally, it is clear that modifications and variations may be made to the device and method described and illustrated herein, without thereby departing from the sphere of protection of the present disclosure.

Figure 4:
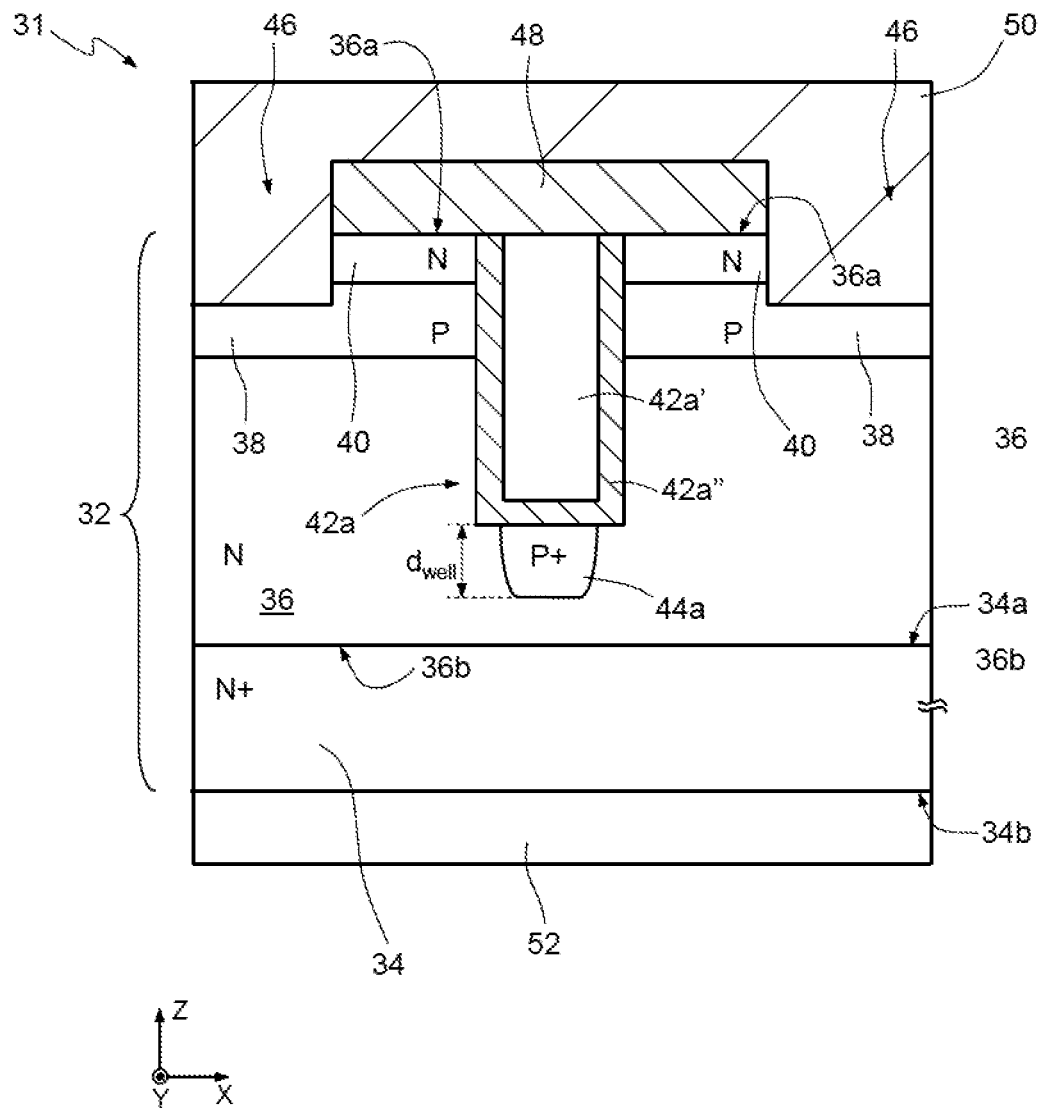
FIG. 4 illustrates an elementary cell of the MOSFET device of FIG. 2.

In particular, it is evident that the MOSFET device 31 of FIG. 2 may comprise any number (chosen according to the need) of gate regions by replicating an elementary cell constituted by the gate region and by the respective self-aligned shielding region. FIG. 4 illustrates an elementary cell of the MOSFET device 31, including a single gate region 42a. The elementary cell of FIG. 4 comprises structural and functional elements corresponding to those already described with reference to FIG. 2, which are designated by corresponding reference numbers and are not described any further.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
forming a structural body of a first type of conductivity;
forming, at a first side of the structural body, a body region of a second type of conductivity opposite to the first type;
forming, at the first side of the structural body, a source region, of the first type of conductivity;
forming a first trench and a second trench in the structural body that both extend from the first side and entirely through the source region and the body region;
forming a first shielding region at a first end of the first trench in the structural body and a second shielding region at a second end of the second trench in the structural body, the first and second shielding regions both of the second type of conductivity, the first and second shielding regions extending towards a second side of the structural body;
forming a gate dielectric layer on sides and a bottom of the first trench and on sides and a bottom of the second trench, sides of the first trench being spaced from sides of the second trench by a portion of the structural body; and
forming a first gate electrode on the gate dielectric layer in the first trench and a second gate electrode on the gate dielectric layer in the second trench, the first gate electrode completely filling the first trench and the second gate electrode completely filling the second trench.

2. The method of claim 1, wherein forming the shielding region comprises:
forming a spacer layer on the sides of the first trench and the second trench, leaving a portion of the structural body at a bottom of the first trench and the second trench being exposed; and
implanting dopant species having the second type of conductivity in the structural body at the bottom of the first trench and the second trench, and wherein forming the first gate electrode and the second gate electrode comprises forming the first gate electrode and the first shielding region to be self-aligned with the sides of the first trench and the second gate electrode and the second shielding region to be self-aligned with sides of the second trench.

3. The method of claim 2, wherein implanting the dopant species comprises forming a first implanted region in the structural body underneath the first trench, forming a second implanted region in the structural body underneath the second trench, and thermally diffusing the first and second implanted regions.

4. The method of claim 1, wherein forming the gate electrode includes forming a surface of the gate electrode coplanar with a surface of the source region.

5. The method of claim 1, further comprising:
forming a source electrode extending in the structural body at the first side, in direct electrical contact with the source region and the body region; and
forming a drain electrode electrically coupled to the second side of the structural body.

6. The method according to claim 1, wherein the forming the structural body includes forming the structural body in a silicon carbide substrate.

7. A method, comprising:
forming a silicon carbide body on and in direct contact with a silicon carbide substrate, the silicon carbide substrate having a first type of conductivity, the silicon carbide body having the first type of conductivity, the silicon carbide body having a first side opposite to a second side, the silicon carbide body having a first surface at the first side;
forming a body region, of a second type of conductivity opposite to the first type of conductivity, which extends in the silicon carbide body at the first side;
forming a source region, having the first type of conductivity, which extends on the body region;
forming a first trench which extends in the silicon carbide body starting from the first side and entirely through the body region and the source region;
forming a spacer layer on sides of the first trench leaving a bottom surface of the silicon carbide body exposed;
forming a shielding region in the bottom surface of the silicon carbide body, the shielding region having the second type of conductivity and positioned entirely within the structural body between an end of the first trench and the second side of the silicon carbide body;
removing the spacer layer after forming the shielding region;
forming a gate electrode in the first trench, the gate electrode filling the first trench from the end of the trench to be coplanar with the first surface of the silicon carbide body.

8. The method of claim 7, wherein forming the trench includes:
forming a gate dielectric of insulating material which extends between the gate electrode and the silicon carbide body and electrically insulating the gate electrode and the silicon carbide body from one another, the shielding region extending in contact with the gate dielectric.

9. The method of claim 7, wherein forming the shielding region includes forming the shielding region aligned to the trench along a plane perpendicular to the first and second sides.

10. The method of claim 7, wherein forming the shielding region includes forming the shielding region having, in a first plane parallel to the first and second sides, an extension equal to or smaller than an extension, in a second plane parallel to the first plane, of the trench.

11. The method of claim 7, comprising:
forming a dielectric layer on the gate electrode and on the first surface of the silicon carbide body; and
forming a second trench through the dielectric layer, through the body source region, and into the body region.

12. The method of claim 7, further comprising:
forming a source electrode, which extends in the silicon carbide body on the first side, in direct electrical contact with the source region and the body region; and
forming a drain electrode electrically coupled to the second side of the silicon carbide body.

13. A method, comprising:
forming a structural body on and in direct contact with a semiconductor substrate, the semiconductor substrate having a first type of conductivity having a first concentration, the structural body having the first conductivity type and a second concentration of dopant species of the first type of conductivity that is less than the first concentration, the structural body having a first surface;
forming a body region in the structural body, the body region having a second conductivity type different than the first conductivity type;
forming first and second source regions in the body region, the first and second source regions having the first type of conductivity;
forming a first trench gate extending through the first source region, the body region, and at least partially into the structural body, the first trench gate having a first surface coplanar with the first surface of the structural body, the first trench gate being a single conductive material region;
forming a second trench gate extending through the second source region, the body region, and at least partially into the structural body, the second trench gate having a first surface coplanar with the first surface of the structural body, the second trench gate being a single conductive material region;
forming a contact trench extending at least partially into the body region, the contact trench disposed laterally between the first source region and the second source region;
forming a first shielding region having the second conductivity type, the first shielding region disposed entirely within the structural body at an end of the first trench gate; and
forming a second shielding region having the second conductivity type, the second shielding region disposed entirely within the structural body at an end of the second trench gate.

14. The method of claim 13, wherein forming the first trench gate and forming the second trench gate includes forming each of the first and second trench gate having a respective single gate electrode and a respective gate dielectric which extends between the gate electrode and the structural body and electrically insulates the gate electrode and the structural body from one another.

15. The method of claim 13, wherein forming the first shielding region and forming the second shielding region includes forming the first and second shielding regions respectively aligned to with the first and second trench gates.

16. The method claim 13, wherein forming the first shielding region includes forming the first shielding region having a thickness that is less than a thickness of the first trench gate, and
forming the second shielding region includes forming the second shielding region having a thickness that is less than a thickness of the second trench gate.

17. The method of claim 13, wherein the structural body has a resistivity between 6.25 Ω·cm and 0.125 Ω·cm, and each of the first and second shielding regions has a resistivity of between $2.5 \cdot 10^{-1}$ Ω·cm and $6.5 \cdot 10^{-3}$ Ω·cm.

18. The method of claim 13, further comprising:
forming a source electrode on the body region, the source electrode contacting the first and second source regions and the body region; and
forming a drain electrode electrically on the structural body, the structural body between the drain electrode and the body region.

19. The method of claim 18, further comprising:
forming a first dielectric region on the first source region and the first trench gate; and
forming a second dielectric region on the second source region and the second trench gate,
wherein the source electrode contacts the first and second dielectric regions and extends into the contact trench.

* * * * *